United States Patent
Fan et al.

(10) Patent No.: US 12,334,353 B2
(45) Date of Patent: Jun. 17, 2025

(54) METHOD AND APPARATUS FOR PLASMA ETCHING

(71) Applicant: SPTS Technologies Limited, Newport (GB)

(72) Inventors: Weikang Fan, Newport (GB); Stephan Shannon L. Lilje, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 17/511,478

(22) Filed: Oct. 26, 2021

(65) Prior Publication Data
US 2022/0208550 A1 Jun. 30, 2022

(30) Foreign Application Priority Data
Dec. 31, 2020 (GB) ...................................... 2020822

(51) Int. Cl.
*H01L 21/306* (2006.01)
*H01J 37/32* (2006.01)
*H01L 21/3065* (2006.01)

(52) U.S. Cl.
CPC .... *H01L 21/3065* (2013.01); *H01J 37/32266* (2013.01); *H01J 37/32146* (2013.01)

(58) Field of Classification Search
None
See application file for complete search history.

(56) References Cited

U.S. PATENT DOCUMENTS

| 10,622,217 | B2 | 4/2020 | Park et al. |
| 2010/0055400 | A1* | 3/2010 | Farr ................... H01L 21/02057 438/719 |
| 2011/0073564 | A1 | 3/2011 | Nangoy et al. |
| 2011/0177669 | A1 | 7/2011 | Lee et al. |
| 2013/0118256 | A1 | 5/2013 | Prandi et al. |
| 2016/0118256 | A1 | 4/2016 | Rastogi et al. |
| 2017/0330764 | A1 | 11/2017 | Lai et al. |
| 2018/0082861 | A1* | 3/2018 | Citla ................... H01L 21/6833 |

(Continued)

FOREIGN PATENT DOCUMENTS

| EP | 1131847 B1 | 2/2010 |
| JP | 2004119702 A | 4/2004 |
| JP | 2010118549 A | 5/2010 |

(Continued)

OTHER PUBLICATIONS

EPO, Extended European Search Report for EP Application No. 21195148, Feb. 21, 2022.

(Continued)

*Primary Examiner* — Duy Vu N Deo
(74) *Attorney, Agent, or Firm* — Hodgson Russ LLP

(57) ABSTRACT

Plasma etching a compound semiconductor substrate includes providing a substrate that includes a compound semiconductor material on a substrate support within a chamber. An etchant gas or gas mixture is introduced into the chamber. A plasma of the etchant gas or gas mixture is sustained within the chamber to plasma etch the compound semiconductor material. A pulsed electrical bias power is applied to the substrate support whilst the plasma is being sustained. The pulsed electrical bias power has a pulse frequency of less than or equal to about 160 Hz and a duty cycle of less than or equal to about 50%.

17 Claims, 3 Drawing Sheets

(56) References Cited

U.S. PATENT DOCUMENTS

2019/0108982 A1\* 4/2019 Yang ................ H01J 37/32449
2020/0402770 A1   12/2020 Yang et al.

FOREIGN PATENT DOCUMENTS

| JP | 2012501540 A | 1/2012 |
| JP | 2017174939 A | 9/2017 |
| TW |  201142941 A | 12/2011 |
| TW |  201923893 A | 6/2019 |
| WO | 2019108366 A1 | 6/2019 |
| WO | 2020243342 A1 | 12/2020 |

OTHER PUBLICATIONS

IPO, Search Report for GB2020822.9, Jun. 9, 2021.
TIPO, Office Action issued for TW Application No. 110139595, Feb. 6, 2025.

\* cited by examiner

METHOD AND APPARATUS FOR PLASMA ETCHING

CROSS-REFERENCE TO RELATED APPLICATIONS

This application claims priority to the UK Patent Application No. 2020822.9 filed Dec. 31, 2020, the disclosure of which is hereby incorporated by reference.

FIELD OF THE DISCLOSURE

This invention relates to a method of plasma etching a compound semiconductor substrate. This invention also relates to an apparatus for plasma etching a compound semiconductor substrate.

BACKGROUND OF THE DISCLOSURE

Compound semiconductors are used in optical devices, high frequency RF devices, power devices and in MEMs applications. The device fabrication typically requires features, such as trenches, to be formed in the compound semiconductor substrate and/or an epitaxial film deposited on the substrate. Such features can be produced using plasma etch technologies.

Current plasma etch technologies include the use of helicon plasmas, electron cyclotron resonance (ECR), reactive-ion etching (RIE), and/or inductively coupled plasmas (ICP). While some application requirements are dependent upon the specific application, it is necessary to control etch rate, etch uniformity, mask selectivity, etch profile and the avoidance of defects, such as microtrenches, in order to achieve optimal results.

ICP technology has certain advantages. For example, ICP technology allows the plasma density to be controlled independently from ion energy, and can provide a large-area, uniform plasma. However, when plasma etching features, such as trenches, in compound semiconductor substrates using an ICP system, there can be a compromise between etch rate and other application requirements, such as the formation of defects (e.g. microtrenches).

In optical waveguide applications or for power semiconductor applications, it is critical to avoid microtrenching. Microtrenches are deeper etched regions at the bottom edges or corners of an etched feature (e.g. a trench). Without wishing to be bound by any theory or conjecture, it is believed that microtrenches are formed due to excessive ion bombardment at the bottom edges of the feature resulting in a higher vertical etch rate in these regions. FIG. 1 shows a cross-sectional representation of a compound semiconductor substrate 10 comprising a trench 12. The trench 12 includes microtrenches 14, which are deeper etched regions at the bottom of the trench 12.

It is desirable to develop a method of plasma etching a compound semiconductor substrate whilst reducing the formation of microtrenches. It is further desirable to reducing the formation of microtrenches without compromising etch rate and/or etch selectivity or any other application requirements.

Known methods to help suppress the formation of microtrenches have employed hydrogen ($H_2$) gas as a process gas. However, the use of H2 gas when etching compound semiconductors is often undesirable. For example, when etching InP or InGaAs materials, a hydrogen based plasma can react with phosphorous and arsenic producing highly volatile byproducts ($PH_3$ and $AsH_3$ respectively).

This can result in undesirable surface properties, and the implantation of H atoms into the surface of the substrate, which can, in turn, lead to unwanted near surface dopant passivation. It is desirable to develop a method of suppressing the formation of microtrenches when plasma etching compound semiconductors without using hydrogen as a process gas.

BRIEF SUMMARY OF THE DISCLOSURE

The present method, at least in some embodiments, seeks to address the above described problems, desires and needs. In particular, the present invention seeks to provide a method for reducing the formation of microtrenches whilst providing adequately high etch rate and/or improved etch selectivity.

According to a first aspect of the present invention there is provided a method of plasma etching a compound semiconductor substrate, the method comprising the steps of:
providing a substrate on a substrate support within a chamber, wherein the substrate comprises a compound semiconductor material;
introducing an etchant gas or gas mixture into the chamber;
sustaining a plasma of the etchant gas or gas mixture within the chamber to plasma etch the compound semiconductor material; and
applying a pulsed electrical bias power to the substrate support whilst the plasma is being sustained;
wherein the pulsed electrical bias power has a pulse frequency of less than or equal to about 160 Hz and a duty cycle of less than or equal to about 50%.

The present inventors found that pulsing the electrical bias power to the substrate whilst the plasma is being sustained unexpectedly reduces the formation of microtrenches. In particular, the combination of a low pulse frequency and a low duty cycle provides an enhanced reduction in the formation of microtrenches. Further still, the combination of applying a pulsed electrical bias power to the substrate at a low pulse frequency and a low duty cycle also provides a significantly enhanced etch selectivity.

The duty cycle can be ≤40%, optionally ≤35%, optionally ≤30%, optionally ≤25%, or optionally about 20%. The duty cycle can be ≥5%, optionally ≥10%, or optionally ≥15%. The duty cycle can be any combination of these upper and lower limits.

The pulse frequency can be ≤150 Hz, optionally ≤125 Hz, optionally ≤100 Hz, optionally ≤75 Hz, optionally ≤50 Hz, optionally ≤25 Hz, optionally ≤20 Hz, optionally ≤15 Hz, optionally ≤10 Hz, optionally ≤5 Hz, optionally ≤2 Hz, or optionally ≤1 Hz. The pulse frequency can be ≥0.1 Hz, optionally ≥0.5 Hz, or optionally ≥0.75 Hz. The pulse frequency can be any combination of these upper and lower limits.

The pulsed electrical bias power typically alternates between a high power and a low (or zero) power. The high power can be in the range of 50-250 W, optionally 60-200 W, optionally 75-150 W, and optionally about 100 W. The low power can be in the range of 0-25 W and is preferably about 0 W. The electrical bias power can be any combination of these upper and lower limits.

The pulsed electrical bias power can be a pulsed RF bias power. The RF bias power can have a frequency of 2-20 MHz, preferably 13.56 MHz.

The etchant gas or gas mixture can comprise a chemical etchant gas. The plasma of the chemical etchant gas can chemically etches the substrate. The chemical etchant gas can be a chlorine-containing chemical etchant gas. The chemical etchant gas can be SiCl4.

The etchant gas or gas mixture can comprise an inert sputter gas. The plasma of the inert sputter gas can sputter etch the substrate. The inert sputter gas can be a noble gas. A noble gas is an element from Group 18 of the Periodic Table of Elements. Preferably, the inert sputter gas is argon gas.

The etchant gas mixture can comprise the chlorine-containing chemical etchant gas, such as $SiCl_4$, and the inert sputter gas, such as argon gas. The etchant gas mixture can consist of or consist essentially of $SiCl_4$ and argon gas. The etchant gas or gas mixture can be devoid of a source of hydrogen (H). For example, the etchant gas or gas mixture can be devoid of hydrogen gas ($H_2$).

The etchant gas or gas mixture can be introduced into the chamber at a total flow rate of less than 200 sccm, optionally less than 150 sccm, optionally less than 100 sccm, optionally less than 80 sccm, optionally less than 60 sccm, optionally about 45 sccm.

The chemical etchant gas can be introduced into the chamber at a flow rate in the range of 1-50 sccm, optionally 2-25 sccm, optionally 3-10 sccm, optionally 4-8 sccm or optionally about 5 sccm.

The inert sputter gas can be introduced into the chamber at a flow rate in the range of 10-150 sccm, optionally 20-100 sccm, optionally 25-75 sccm, optionally 30-50 sccm, or optionally about 40 sccm.

The chemical etchant gas and the inert sputter gas can be introduced into the chamber at flow rates (in sccm) in a ratio in the range of 1:1 to 1:50, optionally 1:2 to 1:25, optionally 1:3 to 1:20, optionally 1:4 to 1:15, optionally 1:5 to 1:10, or optionally about 1:8.

The plasma is preferably an inductively coupled plasma. The method can be performed using an inductively coupled plasma apparatus.

The substrate support can comprise an electrostatic chuck (ESC). An electrostatic chuck can provide sufficient cooling to the substrate during the plasma etch process.

The compound semiconductor material can comprises a IV-IV, III-V or II-VI compound semiconductor. The formation of microtrenches is a particular problem for high band gap Group 14 compound semiconductors (e.g. SiC), III-V compound semiconductors, and II-VI compound semiconductors. The present method provides has particular application in suppressing the formation of microtrenches in such compound semiconductors.

The compound semiconductor material can comprises a material selected from InGaAs, InP, GaN, GaP, AlGaAs, and SiC. The substrate can comprise a stack of layers each layer made from a compound semiconductor material. For example, the stack of layers can comprise InP/InGaAs/InP. The substrate can be an epi- wafer.

The plasma etch can form a feature, such as a trench. The trench can have side walls inclined at an angle in the range of about 88.0-90.0°, or preferably about 89.0° to 90.0 ° (i.e. the trench is slightly tapered towards its base).

According to a second aspect of the invention there is provided an apparatus for plasma etching a compound semiconductor substrate using the method according to any previous claim, the apparatus comprising: a chamber;
a substrate support disposed within the chamber;
a plasma generation device for sustaining a plasma within the chamber; an electrical power supply for supplying an electrical bias power to the substrate support; and
a controller configured to control the electrical power supply so as to apply a pulsed electrical bias power to the substrate support whilst the plasma is being sustained, wherein the pulsed electrical bias power has a pulse frequency of less than or equal to about 160 Hz and a duty cycle of less than or equal to about 50%. The plasma generation device can be for sustaining an inductively coupled plasma within the chamber. The plasma generation device can comprise a coil. An RF power supply can provide an RF power to the coil so as to sustain an inductively coupled plasma within the chamber. The RF power supplied to the coil can have a frequency of 2-20 MHz, and is preferably 13.56 MHz.

Whilst the invention has been described above, it extends to any inventive combination of the features set out above, or in the following description, drawings or claims. For example, any features disclosed in relation to one aspect of the invention can be combined with any features disclosed in relation to any other aspect of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
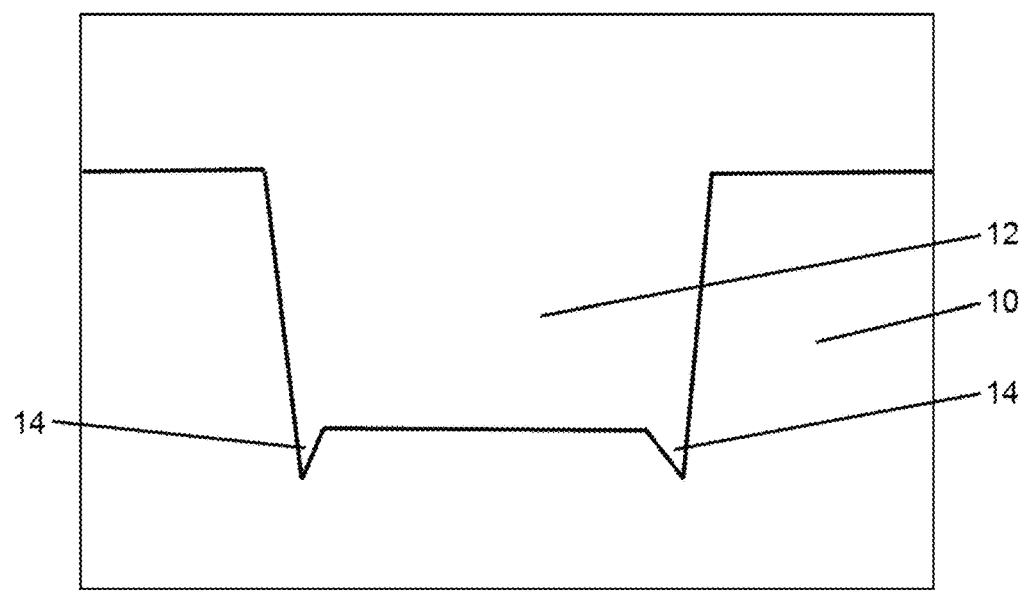
FIG. 1 is schematic cross-sectional view of a trench in a compound semiconductor substrate.
Figure 2:
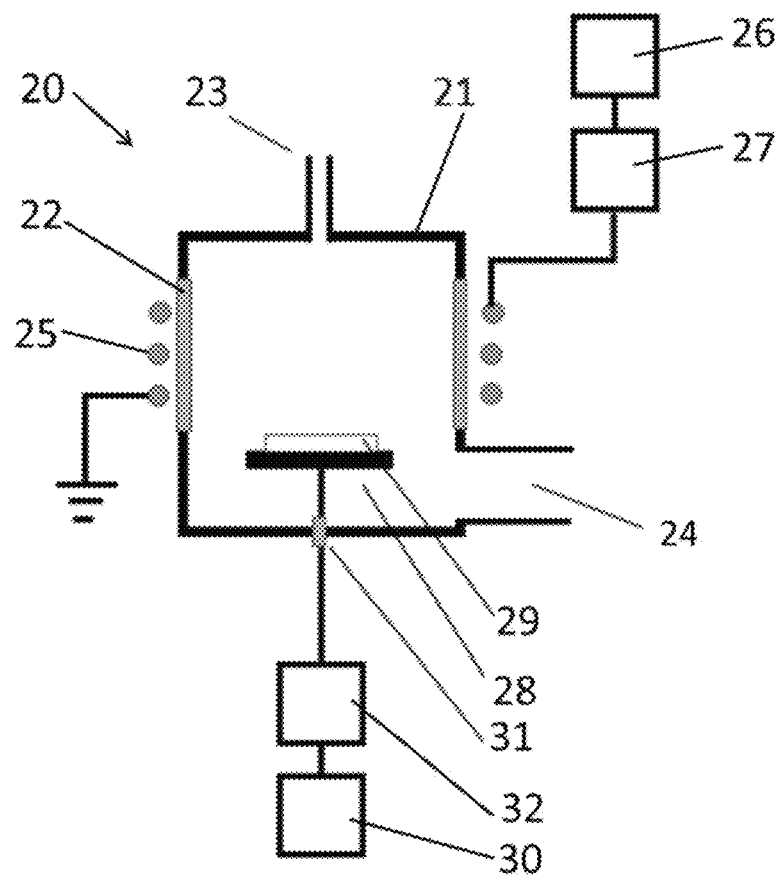
FIG. 2 is a schematic cross-sectional view of an inductively coupled plasma apparatus.

FIG. 2 shows an apparatus 20 suitable for plasma etching a compound semiconductor substrate. Apparatus suitable for performing the methods of the present invention include an adapted SPTS Omega(RTM) ICP etch system, which is commercially available from SPTS Technologies Limited, located in Newport, South Wales, UK. All exemplary embodiments and comparative examples described below were performed using this adapted apparatus.

The apparatus 20 comprises a chamber 21 and a plasma generation device for sustaining a plasma within the chamber. The chamber 21 comprises a dielectric cylindrical wall portion 22, which is typically made of $Al_2O_3$. The chamber further comprises a gas inlet 23, through which process gases can be introduced into the chamber 21, and a gas outlet 24 through which gases can be removed from the chamber using a suitable pump.

The plasma generation device comprises a coil 25, which can be electrically driven by an RF power supply 26 via an impedance matching network 27. The coil 25 is disposed around the dielectric wall 22. The RF power supply 26 typically provides an RF power to the coil 25 at a frequency of 2-20 MHz, although lower frequencies can be employed (e.g. 380 kHz).

The apparatus 20 further comprises a substrate support 28 onto which a compound semiconductor substrate 29 can be positioned for processing. The substrate 29 can be a substrate comprising a IV-IV compound semiconductor (e.g. SiC), a III-V compound semiconductor (e.g. InGaAs, InP, GaN, GaP or AlGaAs), or a II-VI compound semiconductor.

The substrate support 28 can be an electrostatic chuck (ESC). The ESC can provide an electrostatic clamping force on the substrate 29 and also provide cooling to the substrate 29 during a plasma treatment. Alternatively or additionally, a mechanical clamp (not shown) can be used to clamp the substrate 29 in position. The substrate support 28 is connected to an electrical power supply, such as an RF power supply, 30 via a ceramic break 31 and an impedance matching network 32. The electrical power supply 30 can provide an electrical bias, such as an RF electrical bias, to the substrate support 28. The RF power supply 30 typically provides an RF power with a frequency of 2-20 MHz, optionally 13.56 MHz, although lower frequencies can be employed (e.g. 380 kHz). A controller (not shown) is configured to pulse the power of the electrical bias applied to the substrate support 28 during a plasma etch process.

According to an embodiment of the present method, a compound semiconductor substrate 29 is provided on the substrate support 28. An etchant gas or gas mixture is introduced into the chamber 21 via the gas inlet 23 at a flow rate. The power supply 26 supplies an RF electrical bias power to the coil 25 via the impedance matching network 27 so as to sustain a plasma of the etchant gas or gas mixture within the chamber 21. The power supply 30 supplies a pulsed RF electrical bias power to the substrate support 28.

The present inventors have found that pulsing an electrical bias to the substrate support 28 during a part or all of a plasma etch treatment can significantly reduce the formation of defects, such as microtrenches occurring.

Figure 3:
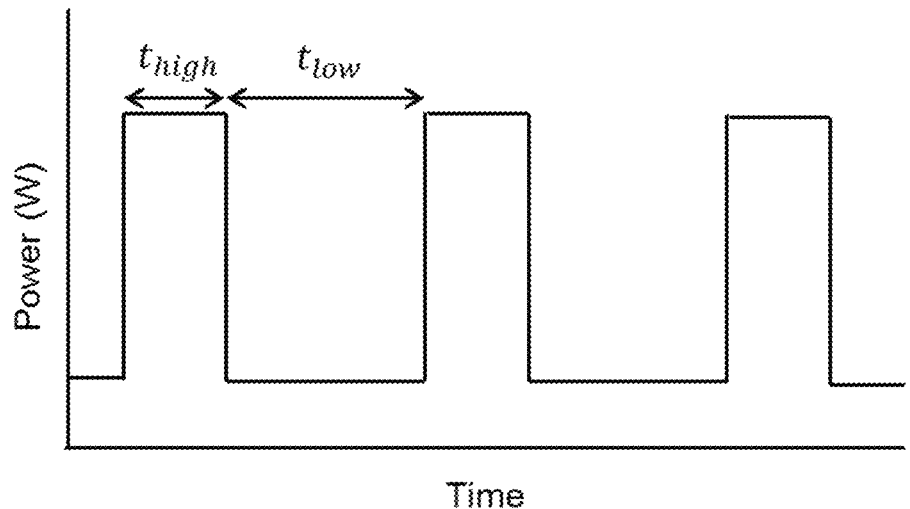
FIG. 3 is an indicative representation of the electrical bias power applied to the substrate support during a plasma etch according to an embodiment.

The pulsed RF electrical bias power has a power that alternates between a low power and a high power. The low power is typically less than 25 W, and is preferably about 0 W. The high power is typically in the range 50-250 W, and optionally about 100 W, although other values may be contemplated. The pulsed RF electrical bias power has a pulse frequency of less than or equal to about 160 Hz. The pulsed RF electrical bias power has a duty cycle of about ≥50%. The duty cycle (as a percentage) is calculated using Formula 1, where $t_{high}$ is the time per pulse that the applied electrical bias power is at high power, and $t_{low}$ is the time per pulse that the applied electrical bias power is at low or zero power (as shown representatively in FIG. 3).

$$\text{Duty cycle (\%)} = \frac{t_{high}}{(t_{high} + t_{low})} \times 100 \quad (1)$$

The sum of $t_{high}$ and $t_{low}$ corresponds to the period of the pulse, which in turn corresponds to the reciprocal of the pulse frequency.

Without wishing to be bound by any theory or conjecture, it is believed that pulsing the electrical bias to the substrate support, in particular at a low frequency (e.g. ≥160 Hz) and a low duty cycle (e.g. ≥50%), allows any charge accumulation at the bottom edges of the trench to be dissipated whilst the electrical bias power is low. This acts to help prevent excessive ion bombardment from occurring at the bottom edges or corners of the etched feature, thereby suppressing the formation of microtrenches.

By way of example only, trenches were plasma etched into an InGaAs substrate using a method according to the invention. The trenches had a width of 25 μm and an etch depth of 3 μm. The InGaAs substrate included a patterned SiO$_2$ hard mask layer with a thickness of 0.5 μm. The mask layer is more resistant to the plasma etch conditions than the areas of exposed InGaAs material. The etchant gas comprised a mixture of SiCl$_4$ and argon gas. The processing conditions used for the plasma etch treatment in these examples are shown in Table 1.

TABLE 1

| | |
|---|---|
| SiCl$_4$ flow rate (sccm) | 5 |
| Ar gas flow rate (sccm) | 40 |
| Coil power (W) | 300 |
| High substrate bias power (W) | 100 |
| Low substrate bias power (W) | 0 |
| Substrate temperature (° C.) | 180 |
| Chamber pressure (mTorr) | 2 |

Table 2 shows how the etch rate (μm/min), the compound semiconductor material to SiO$_2$ etch selectivity ratio, the angle of the side wall, and the microtrench ratio value (MTR) varied as a function of pulse frequency and duty cycle of the electrical bias applied to the substrate support. All other parameters remained constant. The microtrench etch ratio (MTR) is the ratio of the etch depth (ED) to the microtrench depth (MD). The MTR value is used to quantify the severity of microtrenching, where a higher MTR value corresponds to less severe microtrenching. Example 1 relates to a plasma etch treatment in which a continuous RF bias (100 W) was applied to the substrate support during the plasma etch process and is provided as a comparison.

TABLE 2

| | RF bias | | | | Process results | | | |
|---|---|---|---|---|---|---|---|---|
| | $t_{high}$ (ms) | $t_{low}$ (ms) | Freq. (Hz) | Duty cycle (%) | Etch rate (μm/min) | Etch selectivity | Angle (°) | MTR |
| 1 | Continuous RF bias | | | | 0.59 | 5.98 | 87.7 | 11.1 |
| 2 | 200 | 700 | 1.11 | 22.2 | 0.34 | 18.96 | 89.0 | Inf. |
| 3 | 400 | 700 | 0.91 | 36.3 | 0.34 | 11.75 | 88.2 | 1245 |
| 4 | 200 | 400 | 1.67 | 33.3 | 0.38 | 20.12 | 89.2 | 3060 |
| 5 | 200 | 300 | 2 | 40 | 0.35 | 12.30 | 88.4 | 51.8 |
| 6 | 20 | 80 | 10 | 20 | 0.40 | 21.25 | 89.0 | Inf. |
| 7 | 1.3 | 5.3 | 152 | 20 | 0.45 | 27.31 | 88.2 | Inf. |

Figure 4:
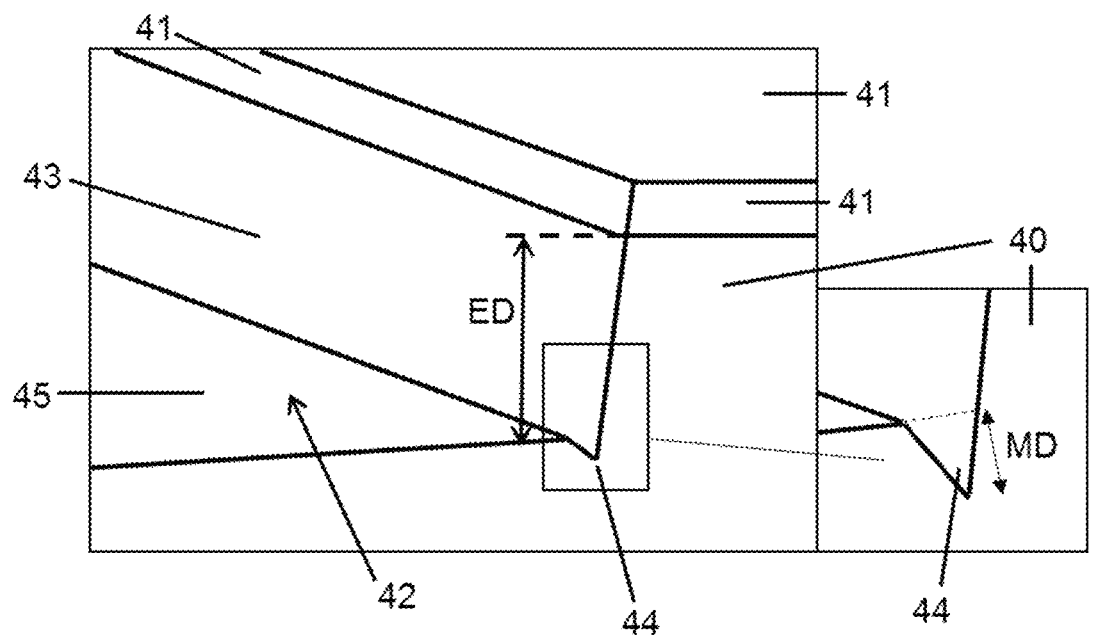
FIG. 4 is a representation of a trench etched using a prior art method.

FIG. 4 shows a schematic, perspective cross-sectional view of the trench etched using Example 1. The inset of FIG. 4 shows a magnified view of the microtrench defect. The substrate 40 comprises a SiO$_2$ mask layer 41 with a thickness of 0.5 μm. The trench 42 is formed in the regions which are not covered by the patterned mask layer 41. The side wall 43 of the trench 42 is substantially aligned with the edge of the mask layer 41. That is, notching (i.e. a lateral etch resulting in an undercut) is not observed. The side wall 43 has an etch angle of 87.7°. For optical waveguide applications, it is desirable for the side wall angle to be about 89° (or as close to 90° as possible). A microtrench 44 is formed at the intersection between the side wall 43 and bottom surface 45 of the trench. The microtrench 44 is aligned with the side wall and corresponds to a region of the bottom wall 45 that has been etched to a greater extent.

Figure 5:
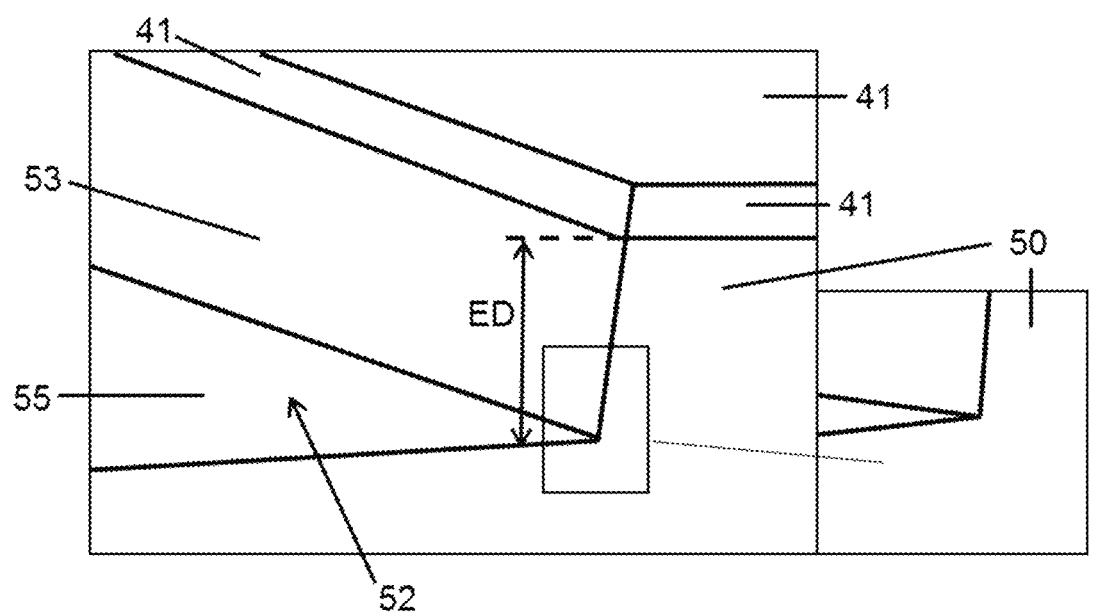
FIG. 5 is a representation of a trench etched using a method according to an embodiment of the invention.

FIG. 5 shows a schematic, perspective cross-sectional view of a trench etched in a compound semiconductor substrate 50 using the processing conditions of Example 6. The inset of FIG. 5 shows a magnified view of the intersect between the side wall 53 and bottom surface 55 of the trench 52. Features labelled with the same reference numeral correspond to features that are identical.

Examples 3, 4 and 5 resulted in an improvement in the MTR value compared to Comparative Example 1. Examples 2, 6 and 7 eliminated the formation of the microtrench, thereby providing a further improvement. Where no microtrench is visible (as measured by SEM), the MTR value has an infinite value. All Examples 2-7 provided a significantly higher etch selectivity compared to Comparative Example 1. This enables a deeper etch to be achieved with a thinner mask layer. All Examples 2-7 beneficially resulted in a side wall angle that was closer to 90°, which provides a better quality device for optical waveguide applications.

Examples 2-7 resulted in a lower etch rate compared to Comparative Example 1. However, the small reduction in etch rate is outweighed by the significant improvements in etch selectivity, side wall angle and MTR value.

The conditions of Example 6 were considered to be most favourable for optical waveguide applications because of the complete absence of microtrenching and the optimal side wall angle.

In particular, the combination of providing a pulsed electrical (RF) bias with a low pulse frequency and low duty cycle provides optimum conditions to significantly reduce (or eliminate) the formation of microtrenches, whilst providing beneficial improvements in etch selectivity and side wall etch angle. Without wishing to be bound by any theory or conjecture, it is believed that pulsing the electrical (RF) bias applied to the substrate support reduces the charge build up on the feature being etched, whilst maintaining excellent process performance. During the low power part of the pulse, any accumulated charge can be (at least partially) dissipated, thereby allowing for a more uniform vertical etch, which results in a significant decrease in the formation of microtrenches. This effect is enhanced at a combination of low pulse frequency (e.g. ≤160 Hz) and low duty cycle (e.g. ≤50%).

By way of a further example only, trenches were etched into a range of different compound semiconductor substrate using the methods of the present invention (Table 3). The substrates included a bulk InP substrate, and an epi-wafer. The epi-wafer comprises a Si wafer with one or more layers of compound semiconductor materials deposited thereon. For example, the epi-wafer can comprise a Si wafer with a layer of GaN deposited thereon. The epi-wafer can comprise a plurality (or stack) of compound semiconductor layers deposited thereon. In one embodiment, the epi-wafer comprises a first layer made from InP, a second layer made from InGaAs, and a third layer made from InP (hereinafter referred to as a "InP/InGaAs/InP substrate"). The epi-wafer can comprise a different number of layers and can comprise different compound semiconductor materials.

TABLE 3

| Substrate material | Thickness | Mask material | Microtrench |
|---|---|---|---|
| InP | Bulk | Oxide | Not observed |
| InP/InGaAs/InP | 1 μm/5 μm/substrate | Oxide | Not observed |
| GaN | 90 nm deep etch on 5 μm GaN on Si substrate | Photoresist | Not observed |

The result of Table 3 indicate that the methods of the present invention can eliminate the formation of microtrenches when etching a variety of different compound semiconductor materials. This includes etching bulk compound semiconductor materials, etching through a plurality of layers of different compound semiconductor materials, and etching substrate with an epi-structure (e.g. epi-wafers). The present method can also be used to eliminate microtrenching when etching other compound semiconductor materials including but not limited to SiC, GaP, and AlGaAs.

Embodiments of the present method are particularly suited to plasma etching substrate comprising a compound semiconductor material because the formation of microtrenches can be suppressed without needing to rely on hydrogen-based chemistries, which can lead to the formation of highly volatile H-related byproducts (e.g. PH3 and AsH3), cause undesirable surface properties, and result in the implantation of H atoms into the surface of the compound semiconductor material, which can, in turn, result in near surface dopant passivation.

The invention claimed is:

1. A method of plasma etching a compound semiconductor substrate, the method comprising the steps of:
providing a substrate on a substrate support within a chamber, wherein the substrate comprises a compound semiconductor material that includes a IV-IV, III-V or II-VI compound semiconductor;
introducing an etchant gas or gas mixture into the chamber, wherein the etchant gas or gas mixture comprises a chlorine-containing chemical etchant gas;
sustaining a plasma of the etchant gas or gas mixture within the chamber to plasma etch the compound semiconductor material, wherein the plasma is an inductively coupled plasma; and
applying a pulsed electrical bias power to the substrate support whilst the plasma of the etchant gas or gas mixture is being sustained;
wherein the pulsed electrical bias power has a pulse frequency of less than or equal to about 160 Hz and a duty cycle of less than or equal to about 50%.

2. The method according to claim 1, in which the duty cycle is ≤40%.

3. The method according to claim 2, in which the duty cycle is ≤25%.

4. The method according to claim 1, in which the duty cycle is ≥5%.

5. The method according to claim 4, in which the duty cycle is ≥15%.

6. The method according to claim 1, in which the pulse frequency is less than or equal to about 150 Hz.

7. The method according to claim 6, in which the pulse frequency is less than or equal to about 1 Hz.

8. The method according to claim 1, in which the pulse frequency is ≥0.1 Hz.

9. The method according to claim 1, in which the pulsed electrical bias power alternates between a high power and a low power, wherein the high power is in the range of 50-250 W, and the low power is in the range of 0-25 W.

10. The method according to claim 1, in which the pulsed electrical bias power is a pulsed RF bias power.

11. The method according to claim 1, in which the chemical etchant gas is $SiCl_4$.

12. The method according to claim 1, in which the etchant gas or gas mixture further comprises an inert sputter gas.

13. The method according to claim 12, in which the inert sputter gas is argon gas.

14. The method according to claim 1, in which the etchant gas or gas mixture consists of or consists essentially of $SiCl_4$ and argon gas.

15. The method according to claim 1, in which the compound semiconductor material comprises a material selected from InGaAs, InP, GaN, GaP, AlGaAs, and SiC.

16. The method according to claim 1, in which the plasma etch forms a feature, and wherein the feature is a trench.

17. The method according to claim 1, in which the pulsed electrical bias power is a pulsed RF bias power, wherein the pulsed electrical bias power alternates between a high power and a low power, wherein the high power is in the range of 50-250 W, and the low power is in the range of 0-25 W.

* * * * *